(12) United States Patent
Dutton

(10) Patent No.: US 8,432,304 B2
(45) Date of Patent: Apr. 30, 2013

(54) ERROR CORRECTION IN THERMOMETER CODES

(75) Inventor: Neale Dutton, Edinburgh (GB)

(73) Assignee: STMicroelectronics (Research & Development) Ltd, Marlow, Buckinghamshire (GB)

( * ) Notice: Subject to any disclaimer, the term of this patent is extended or adjusted under 35 U.S.C. 154(b) by 62 days.

(21) Appl. No.: 13/243,155

(22) Filed: Sep. 23, 2011

(65) Prior Publication Data
US 2012/0154187 A1 Jun. 21, 2012

(30) Foreign Application Priority Data

Dec. 15, 2010 (GB) .................................... 1021290.0

(51) Int. Cl.
*H03M 1/06* (2006.01)
(52) U.S. Cl.
USPC .............. 341/118; 341/94; 341/159; 341/160
(58) Field of Classification Search ..................... 341/94, 341/118, 159–160
See application file for complete search history.

(56) References Cited

U.S. PATENT DOCUMENTS

| | | | | |
|---|---|---|---|---|
| 4,897,657 A * | 1/1990 | Brubaker | ....................... | 341/159 |
| 4,983,968 A * | 1/1991 | Nguyen et al. | ................ | 341/118 |
| 5,959,564 A * | 9/1999 | Gross, Jr. | ....................... | 341/160 |
| 6,034,631 A | 3/2000 | Gross, Jr. | | |
| 6,633,250 B2 * | 10/2003 | Lee et al. | ....................... | 341/160 |
| 7,327,292 B2 * | 2/2008 | Lee et al. | ......................... | 341/94 |
| 8,185,572 B2 * | 5/2012 | Singh | ............................. | 708/530 |
| 2006/0055574 A1 | 3/2006 | Maksimovic et al. | | |
| 2007/0008201 A1 | 1/2007 | Lee et al. | | |
| 2009/0153387 A1 | 6/2009 | Tayu | | |
| 2010/0134335 A1 | 6/2010 | Park et al. | | |

OTHER PUBLICATIONS

UK Search Report mailed Apr. 15, 2011 for GB 1021290.0 (1 page).

* cited by examiner

*Primary Examiner* — Khai M Nguyen
(74) *Attorney, Agent, or Firm* — Gardere Wynne Sewell LLP

(57) ABSTRACT

A thermometer coded line is configured to convert a time interval to a digital code for subsequent processing in order to output a value representative of said time interval. A digital peak detector is coupled to receive output from the thermometer coded line, the detector operating for correction of an undesired code of said digital code in order to ensure a valid output of said value. A majority logic circuit is coupled between the thermometer coded line and the digital peak detector, the logic circuit operating for correction of undesired code of said digital code in order to ensure the valid output of said value. The detector functions to correct any undesired code not corrected by, or introduced by, the logic circuit.

19 Claims, 16 Drawing Sheets

ERROR CORRECTION IN THERMOMETER CODES

PRIORITY CLAIM

This application claims priority from Great Britain Application for Patent No. 1021290.0 filed Dec. 15, 2010, the disclosure of which is hereby incorporated by reference.

TECHNICAL FIELD

The disclosure relates to electronics and thermometer coded devices such as time to digital converters (TDCs), and more specifically to error correction and to an integrated circuit, an apparatus, a method and a computer program product for error correction in thermometer codes.

BACKGROUND

Time to digital converters (TDCs) are designed to generate a digital representation of a time interval elapsing between two events. A TDC converts a time interval directly to a digital code for any subsequent processing.

Clocked delay line time to digital converters (TDCs) or flash analog to digital converters (ADCs) are a couple of examples of very fast thermometer-coded devices. For such devices the propagation delays may be in the region of 20-30 picoseconds as seen for example in deep sub-micron (DSM) inverters. However, when sampling the state of the delay line on the clock edge, there is a need for improving reliability of the devices. For example, metastability is possible where the sampled state of one or more of the line taps is undefined (neither high nor low). Thus, the signal can be within an undesired state. This may cause an error in the thermometer code.

In current known TDCs, and equivalently in flash ADCs, an error code often results in a waste of the appropriate conversion cycle. For example, when an erroneous code is passed out, it is a waste of a complete valid conversion cycle. Consequently it causes errors in the output signal.

In cases where the output code addresses an information lookup table, more than one address may be looked up causing the lookup table output to be in an unknown (and undesired) state. There is therefore a need in the art for techniques for improving reliability of thermometer coded lines without substantially producing false alarms or wrong results.

SUMMARY

According to a first aspect of the present disclosure there is provided an integrated circuit, comprising: a thermometer coded line configured to convert a time interval to a digital code for subsequent processing in order to output a value representative of said time interval; and a digital peak detector coupled with the thermometer coded line configured to correct an undesired code of said digital code in order to ensure a valid output of said value.

Optionally, said integrated circuit further comprises comprising a majority logic coupled with the thermometer coded line and with the digital peak detector, wherein the majority logic is configured to correct the undesired code of said digital code in order to ensure the valid output of said value.

Optionally, the majority logic is configured to correct most undesired code errors and the digital peak detector is configured to further correct the undesired code left uncorrected by the majority logic.

Optionally, the majority logic is coupled between the thermometer coded line and the digital peak detector.

Optionally, the majority logic is coupled with an output of the thermometer coded line.

Optionally, the majority logic is coupled with an output of the thermometer coded line and with two consecutive neighboring outputs of said output.

Optionally, the majority logic is coupled with an output of the thermometer coded line and with two up and two down neighboring outputs of said output.

Optionally, the digital peak detector is coupled with the output of the majority logic.

Optionally, the digital peak detector is coupled with a binary converter, and the digital peak detector is configured to feed the binary converter so that the digital peak detector is configured to output encoded 1 of N logic output to a lookup table of the binary converter, wherein binary converter is configured to match from the lookup table the corresponding value matching the output.

Optionally, the digital peak detector is coupled with a combinational logic thermometer to binary converter, and the digital peak detector is configured to feed the combinational logic thermometer to binary converter a thermometer code, wherein the combinational logic thermometer to binary converter is further configured to output the value corresponding with the code.

Optionally, the thermometer coded line comprises a clocked delay line for time to digital converter, TDC, or a resistor line for flash analog to digital converter, ADC.

Optionally, the thermometer coded line further comprises a thermometer code read out unit coupled with the thermometer coded line, wherein the thermometer code read out unit is configured to receive input from the thermometer coded line and output said digital code.

According to a second aspect of the present disclosure there is provided an apparatus comprising a thermometer coded line configured to convert a time interval to a digital code for subsequent processing in order to output a value representative of said time interval; and a digital peak detector coupled with the thermometer coded line configured to correct an undesired code of said digital code in order to ensure a valid output of said value.

Optionally, the apparatus comprises an optical range finder apparatus configured to measure a physical distance to a target.

Optionally, the apparatus further comprises diodes configured to produce an electrical pulse on a reception of a photon indicative of the time of flight of a pulse of light travelling the range for measuring the distance to the target.

According to a third aspect of the present disclosure there is provided a method, comprising: converting a time interval to a digital code for subsequent processing in order to output a value representative of said time interval in a thermometer coded line; and correcting an undesired code of said digital code in order to ensure a valid output of said value in a digital peak detector coupled with the thermometer coded line.

According to a fourth aspect of the present disclosure there is provided a computer program product, comprising computer program code configured to: convert a time interval to a digital code for subsequent processing in order to output a value representative of said time interval in a thermometer coded line; and correct an undesired code of said digital code in order to ensure a valid output of said value in a digital peak detector coupled with the thermometer coded line.

According to a fifth aspect of the present disclosure there is provided an integrated circuit, comprising: a clocked delay line time to digital converter (TDC) configured to convert a time interval to a digital code for subsequent processing in order to output a value representative of said time interval; a majority logic coupled with the clocked delay line TDC, the majority logic configured to correct an undesired code of said digital code in order to ensure a valid output of said value.

Embodiments of the disclosure ensures a valid thermometer code output resulting in a desired value of the code by using correction logic so as to avoid possible error codes and undesired values.

DETAILED DESCRIPTION OF EXEMPLARY EMBODIMENTS

An embodiment of the disclosure relates to an integrated circuit, an apparatus, a method and a computer program product for thermometer code error correction for thermometer coded devices. By using at least one type of correctional logic these possible code errors can be avoided. An embodiment of the disclosure uses a digital peak detector to ensure a valid thermometer code output. Another embodiment of the disclosure uses majority logic to ensure error correction to thermometer code output. In a further embodiment of the disclosure can apply both a digital peak detector and majority logic.

Figure 12:
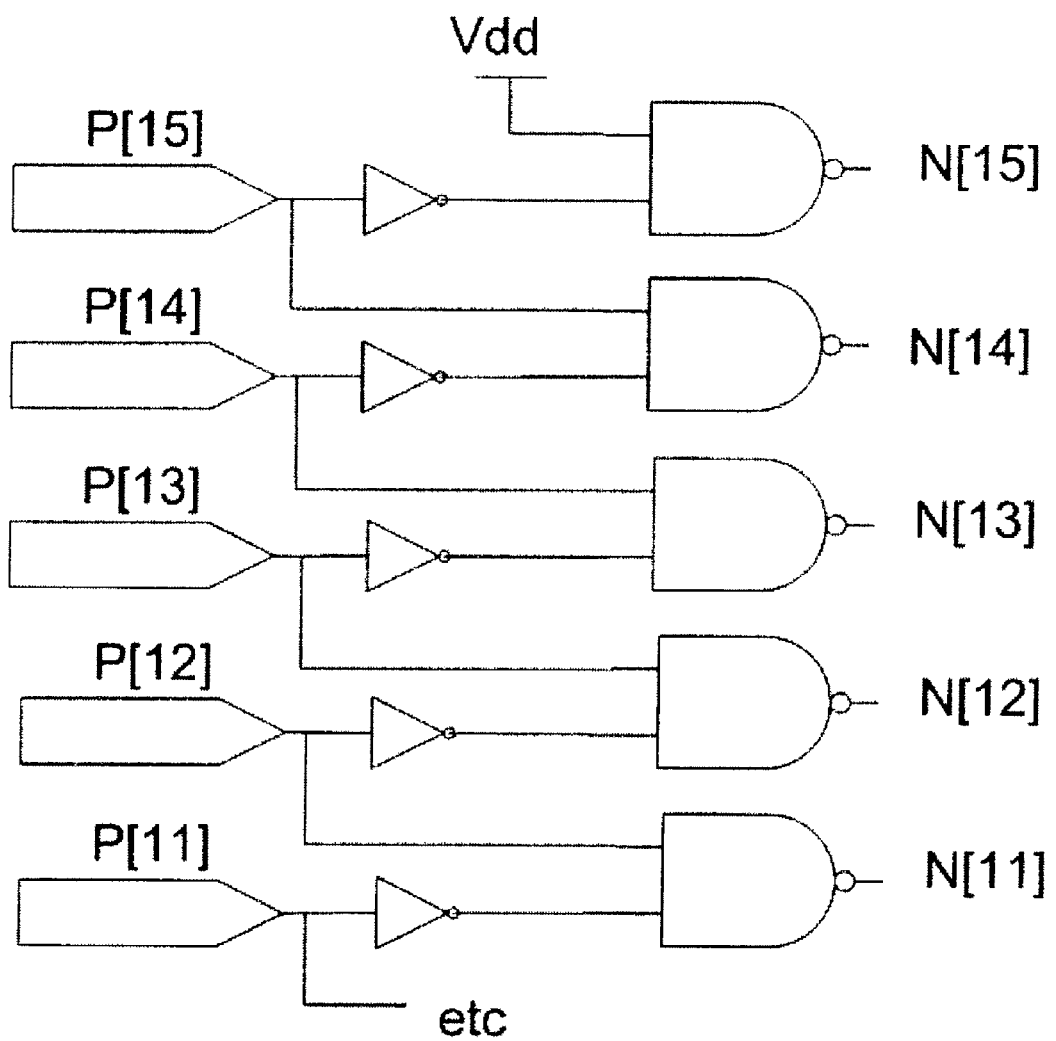
FIG. 12 depicts one embodiment of a 1 of N logic block.
Figure 13:
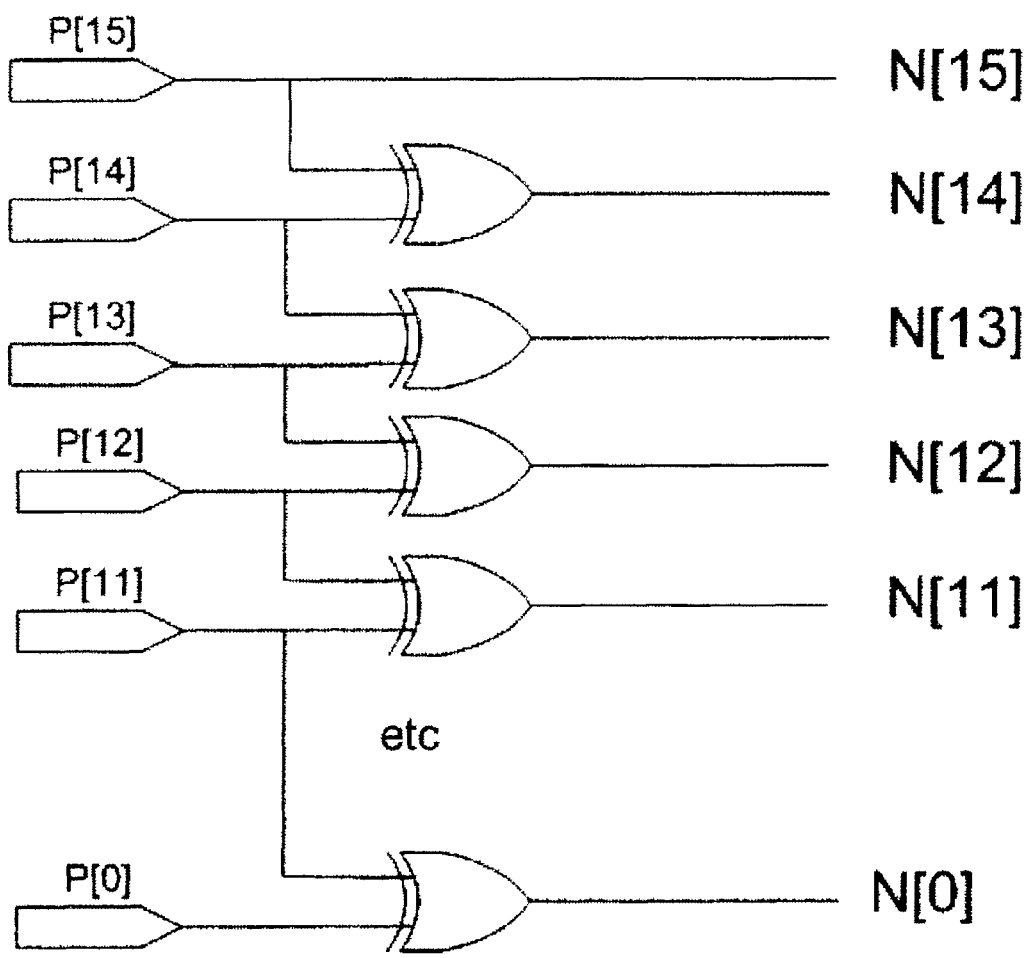
FIG. 13 depicts an alternative embodiment of a 1 of N logic block.

In an embodiment the majority logic is configured to correct for most code errors. Code errors may also be referred to as coded "bubbles" within the code. Despite good error correction of the majority logic, certain error combinations of two or more errors may not be fully corrected. Therefore, in an embodiment, a digital peak detector can be used to better ensure that a correctly thermometer coded value can be output. The thermometer code correction comprising the digital peak detector can be used to correct for all possible code errors, including for example the "bubbles" in the code. In an embodiment of the disclosure the digital peak detector is analogous to an analog peak detector. It follows the thermometer code (base 1 number) signal peak. The digital peak detector is configured to force all outputs below it high. For example forcing a 0 to move high to 1, i.e. for example changing " . . . 1101000 . . . " into " . . . 1111000 . . . ". The majority logic corrects nearly all thermometer code errors except for a few. A digital peak detector can then be provided to ensure substantially no code errors get through. When the digital peak detector is combined with a '1 of N' detector (the output of the digital peak detector being coupled to the 1 of N detector), the output is converted to a base 2 format in preparation for being stored in memory. The 1 of N detector can be take a variety of forms, for example a series of NOT and NAND gates as shown in FIG. 12 or a series of XOR gates as shown in FIG. 13.

Some embodiments of the disclosure provide a time to digital converter (TDC). A TDC can be configured to convert a time interval directly to a digital code for subsequent processing in order to output a range value. In electronic instrumentation and signal processing, a TDC is used for converting a signal of sporadic pulses into a digital representation of their time indices. In other words, a TDC outputs the time of arrival for each incoming pulse. Because the magnitudes of the pulses are not usually measured, a TDC is used when the important information is to be found in the timing of events. TDCs are most often used in applications where measurement events happen infrequently, such as high energy physics experiments, where the sheer number of data channels in most detectors ensures that each channel will be excited only infrequently by particles such as electrons, photons, and ions. In its simplest implementation, a TDC is simply a high-frequency counter with a buffered output.

Some embodiments of the disclosure apply a thermometer code. Thermometer code is effectively base-1 code. The terms "thermometer code" and "base-1 code" can be used interchangeably. This numerical base system is named a thermometer code because it works similarly to a thermometer, that is, the number of "1"s in the code adds up to the number counted, the way the mercury in a thermometer adds up to the temperature reading. It is used in some high-speed analog-to-digital converters in which there is one digital level for each possible output code (e.g. 256 levels for 8-bits) and for a given analog input all digital levels below the input value are 1 and all above are 0.

Figure 3:
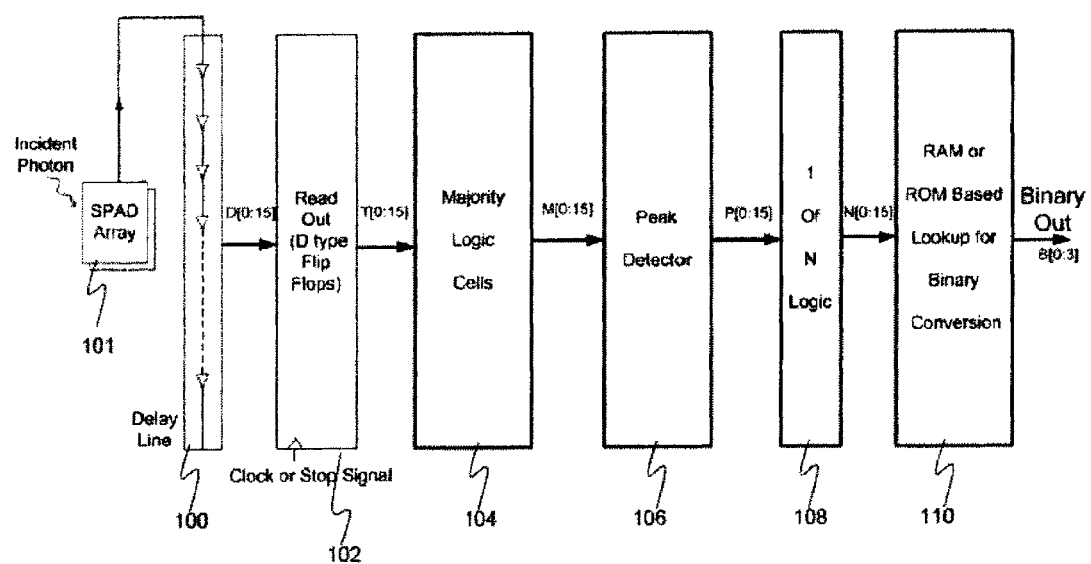
FIG. 3 depicts a block diagram showing an overview of thermometer code error correction according to an embodiment.

Referring first of all to FIG. 3, there is depicted an overview of block diagram according to an embodiment of the disclosure. The block diagram of FIG. 3 can at least partly be an example of the block diagram of an integrated circuit or an apparatus according to an embodiment of the disclosure. In FIG. 3 a delay line 100 receives an input from a sensor array 101 which in a preferred embodiment comprises an array of single photon avalanche detectors (SPADs).

A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger Mode'.

U.S. Pat. No. 7,262,402, incorporated herein by reference, discloses an imaging device using an array of SPADs for capturing a depth and intensity map of a scene, when the scene is illuminated by an optical pulse.

US 2007/0182949, incorporated herein by reference, discloses an arrangement for measuring the distance to an object. The arrangement uses a modulated photonic wave to illuminate the object and an array of SPADs to detect the reflected wave. Various methods of analysis are disclosed to reduce the effects of interference in the reflected wave.

A SPAD can be used in a ranging application by performing a direct time of flight measurement. The term "ranging" in this application is intended to cover all ranging devices and methods including by not limited to ranging devices, proximity devices accelerometers etc. Ranging can occur in a number of applications, including proximity detection which is relatively easy to implement and inexpensive. Laser ranging which is more complex and costly than a proximity detector; and three-dimensional imaging which is a high-end application that could be used to recognize gestures and facial expressions.

A proximity sensor is the most basic of the ranging applications. At its simplest the sensor is capable of indicating the presence or absence of a user or object. Additional computation and illuminator complexity can provide enhanced data such as the range to an object. A typical range is of the order 0.01 m to 0.5 m. In a simple proximity sensor the illumination source could be a modulated LED, at a wavelength of about 850 nm.

The next application group is that of laser ranging, where the illumination source is a modulated diode laser. Performance can range from <1 cm to 20 m range (and higher for top end systems) with millimetric accuracy. Requirements on optics are enhanced, with hemispherical lenses and narrow bandpass filters being required. A near-field return may results in the introduction of parallax error, i.e. movement of the returned laser spot over the sensor pixel array dependent on distance to object. To overcome these problems the ranger includes calibration functions to enable the subtraction of the electronic and optical delay through the host system. The illumination source wavelength should be visible so that the user can see what is being targeted and is typically around 635 nm.

The third application group is that of 3D cameras. In this application a pixel array is used in order to avoid mechanical scanning of the array. Systems can be based on a number of different architectures. Both time of flight (TOF) and modulated illuminator based architectures are used, however, the latter is more robust to ambient light and thus fits best with established photodiode construction. Additional features such as face and gesture recognition are applications of this type of ranging device.

Most optical ranging implementations use either stereoscopic, structured light, direct time of flight or phase extraction methods in order to ascertain the range to a target. Stereoscopic solutions use two conventional cameras, and can have a heavy computation overhead in order to extract range. The structured light scheme uses diffractive optics and the range is computed using a conventional camera based on how a known projected shape or matrix of spots is deformed as it strikes the target. The direct time of flight (TOF) method uses a narrow pulsed laser, with a time-digital converter (TDC) measuring the difference in time between transmission and first photon reception. Commonly, a 'reverse mode' is employed, where the TDC measures the back-portion of time, i.e. the time from first photon reception to next pulse transmission. This scheme minimizes system activity to only the occasions where a photon is detected, and is therefore well matched to tightly controlled, low photon flux levels and medical applications such as fluorescent lifetime microscopy (FLIM).

It is important to understand the range equation derivation as it indicates the ease of applicability of SPADs to phase extraction proximity detection and ranging solutions. It also aids in the understanding of measuring a depth of interest for a specific purpose.

Distance is determined from the speed of light and TOF, as follows:

$$s=ct$$

Where s is distance, c the speed of light and t is time. For a ranging system however, the distance is doubled due to the fact there are send and receive paths. As such the distance measured in a ranging system s is given by:

$$s=\frac{1}{2}ct$$

The power consumption of SPADs and their readout circuits is dependent on the incident photon arrival rate. The average power consumption of a ranging system could be reduced by using power saving modes such as pulsed on/off operation, at a rate of ~10 Hz for example, at the expense of target motion distortion.

The sensor may be implemented on a 1 mm$^2$ die size and the I2C module could also be implemented on an appropriate die. The sensor may include an optical package, an integral IR bandpass Filter (either coating or inherent in the optical elements) and an optimal field of view of about 30°. As the sensor is not intended to "create an image" but is instead used to ensure that as many photons as possible are detected the optics could be made from injection molded hemispherical elements.

The illuminator source should ideally be of a non-visible wavelength, for example in the Near Infra Red (NIR) band, such as 850 nm.

It should be noted that the terms "optical", "illumination" and "light" are intended to cover other wavelength ranges in the spectrum and are not limited to the visual spectrum.

As previously indicated the proximity sensor of the present invention is very versatile and can be used in a vast array of different applications. One such application is now described.

SPADs can be used, for example, as a detector in time correlated imagers such as optical range finders. Optical range finders measure the time of flight, ToF, of a pulse of light. This is used to measure, for example the distance to the target object.

Figure 1:
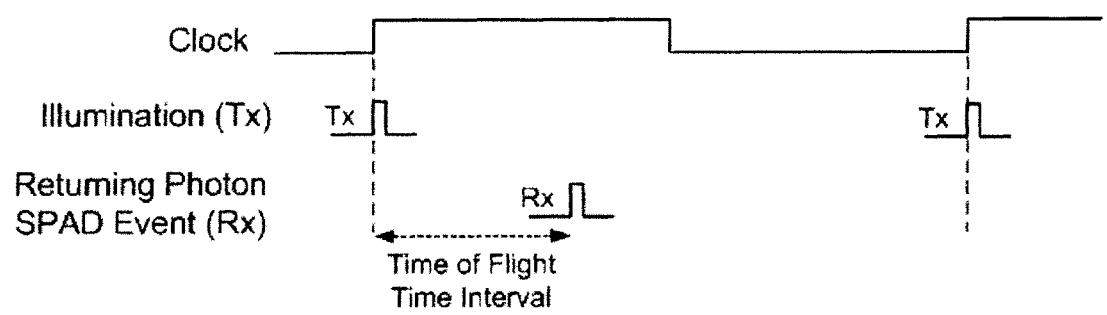
FIG. 1 is an example of a diagram for illustrating principles for a time of flight calculation.

FIG. 1 schematically illustrates the principle of a time of flight calculation, showing the variation of various pulses and events with respect to time. An illumination source is set up to emit short pulses (transmission Tx) at the rising edge of successive clock cycles. A reflected signal is detected as an event (received pulse Rx) by a detector, which may in an embodiment comprise a SPAD. The time between the transmitted pulse Tx and the received pulse Rx is the time of flight time interval and is used to calculate the distance of an object from the transmitter/sensor apparatus.

Figure 2:
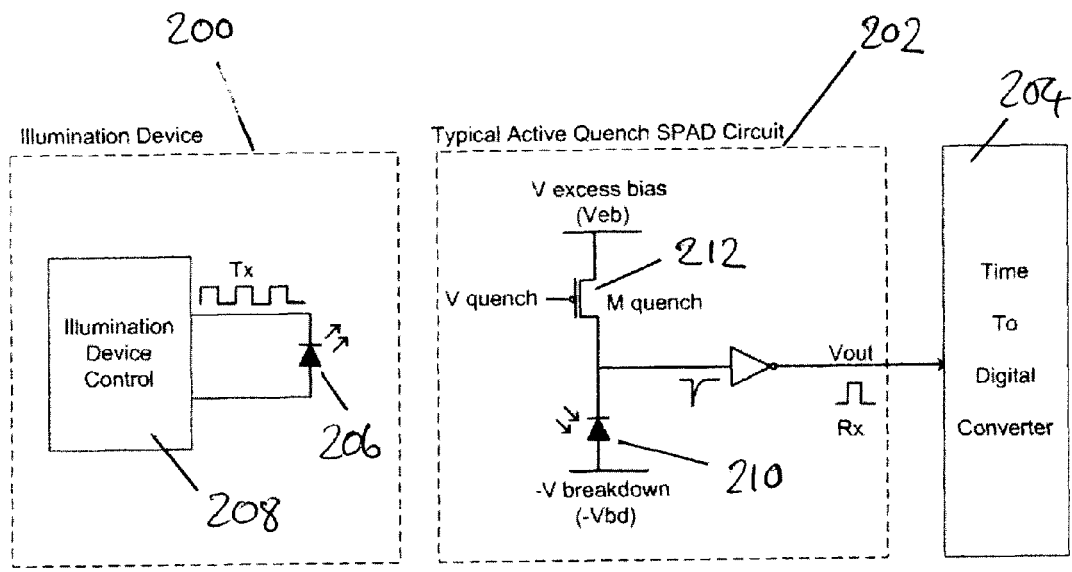
FIG. 2 is an example of a block diagram combining the FIG. 1 with an illumination device and a SPAD circuit.
Figure 2:
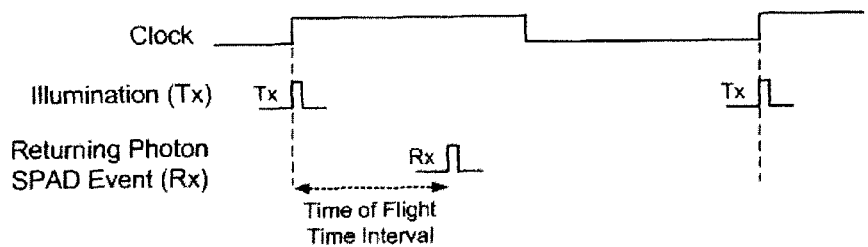

FIG. 2 combines the FIG. 1 timing diagram with a block diagram with the illumination device 200 and SPAD circuit 202 included. The illumination source 200 comprises a diode 206 with appropriate control circuitry 208. The control circuitry 208 controls the diode 206 to successive pulses of radiation. The SPAD circuit 202 as illustrated is an active quench SPAD circuit, comprising a photodiode 210 and p-type MOSFET 212. The SPAD circuit 202 provides an output, which may for example be coupled to a TDC 204.

Referring now to FIG. 3, a SPAD event signal is input into delay line unit 100. Delay line unit 100 is coupled to a thermometer code read out unit 102 consisting of D type flip flops or similar. The delay line 100 together with the thermometer code read out logic block (referred to as D type flip flops in FIG. 3) unit 102 output a thermometer code T[0:15] indicative of the time of arrival of the SPAD event. Thus, the thermometer coded line may comprise the delay line unit 100 and the thermometer code read out unit 102. Alternatively, the thermometer coded line comprises the delay line unit 100 and can be coupled with the thermometer code read out unit 102. The thermometer code T[0:15] is indicative of the distance measured as described above. Some exemplary examples of the thermometer coded line unit 102 can be the clocked delay line TDC or a resistor line for flash ADC. The thermometer code read out unit 102 is coupled to a majority logic block 104, alternatively referred to as majority logic cells. The thermometer code T[0:15] is input into the majority logic cells 104. The majority logic cells 104 are configured to perform first error correction to the code T[0:15] in order to output corrected code M[0:15]. Most code errors are corrected in M[0:15] code. The majority logic 104 is coupled to a digital peak detector 106. The code M[0:15] is input into the digital peak detector 106. The digital peak detector 106 is configured to further correct the code M[0:15]. The digital peak detector 106 outputs the further corrected code P[0:15] into 1 of N logic 108. The digital peak detector can be coupled to 1 of N logic 108. The 1 of N logic 108 is just one alternative output for the feed of the P[0:15] code. The 1 of N logic 108 processes to code P[0:15] to output logic code N[0:15], which is feed into a binary conversion 110. For example, ROM based lookup binary conversion unit receives the logic node N[0:15] and processes the code N[0:15] to output a binary output B[0:3]. The binary output B[0:3] can be a natural binary coded value of the error corrected state of the thermometer coded device, thereby indicating relatively reliably the correct value of the range indicated by delay line unit 100.

The following examples demonstrate some examples of code error(s), which can be corrected by the digital peak detector 106. For example, if a code error is not corrected by the majority logic, a digital peak detector 106 can be used to perform a further correction of the code and ensure that substantially no code errors occur.

For the majority logic 104 typically there can be one 0 to 1 code transition. Any others may cause errors in the subsequent logic. The majority logic 104 is accordingly used to make sure the error code is corrected to the most likely corrected code. For example Error code: 0000011110111111 (decimal 11 most likely, right to left direction as represented here)

Majority logic: 0000011111111111 (decimal 11, right to left direction as represented here)

In this example the majority logic 104 corrects the error and there is no further need for the digital peak detector 106 for error correction.

However in some erroneous codes there can be two logic zeros preceding the high or highest logic 1.

Error code: 0000010011111111 (decimal 11 or decimal 8, right to left direction as represented here)

Now the majority logic 104 assumes that the single 1 with two 0's either side " . . . 00100 . . . " is not likely and probably wrong. Therefore the majority logic 104 tries to correct it.

Majority logic: 0000000011111111 (decimal 8, from right to left direction as represented here, which is more likely to be the correct representation of the original code)

Figure 4:
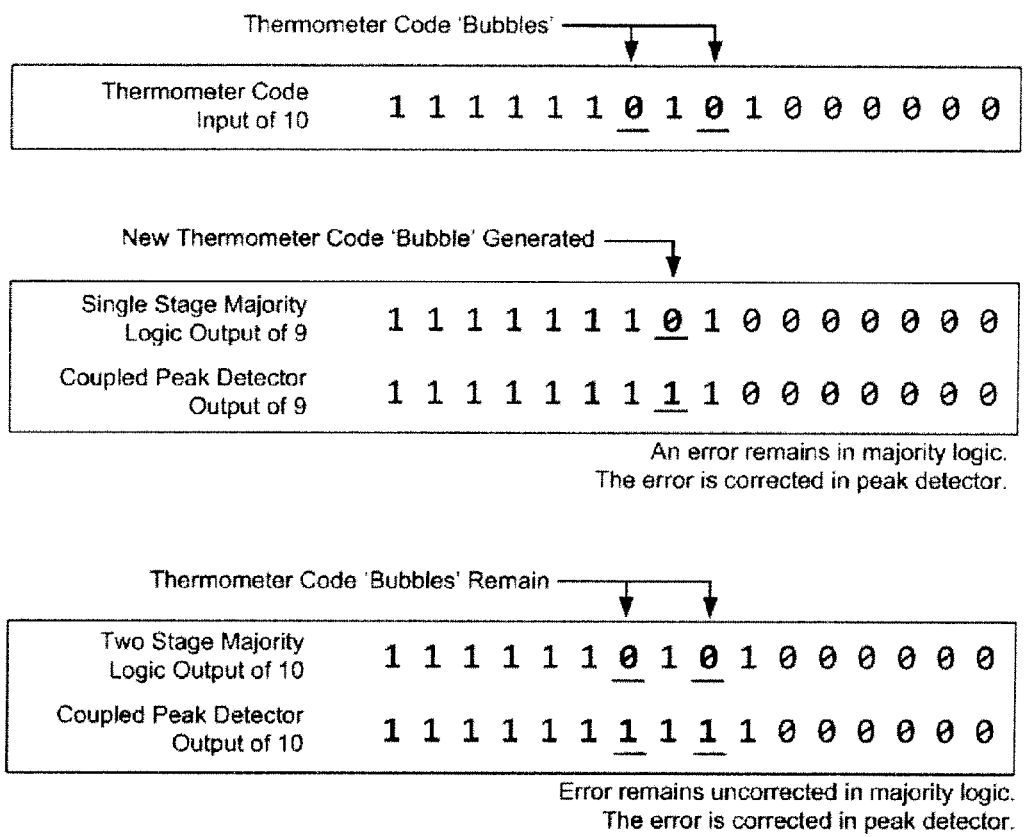
FIG. 4 illustrates a first example error correction process according to an embodiment.
Figure 5:
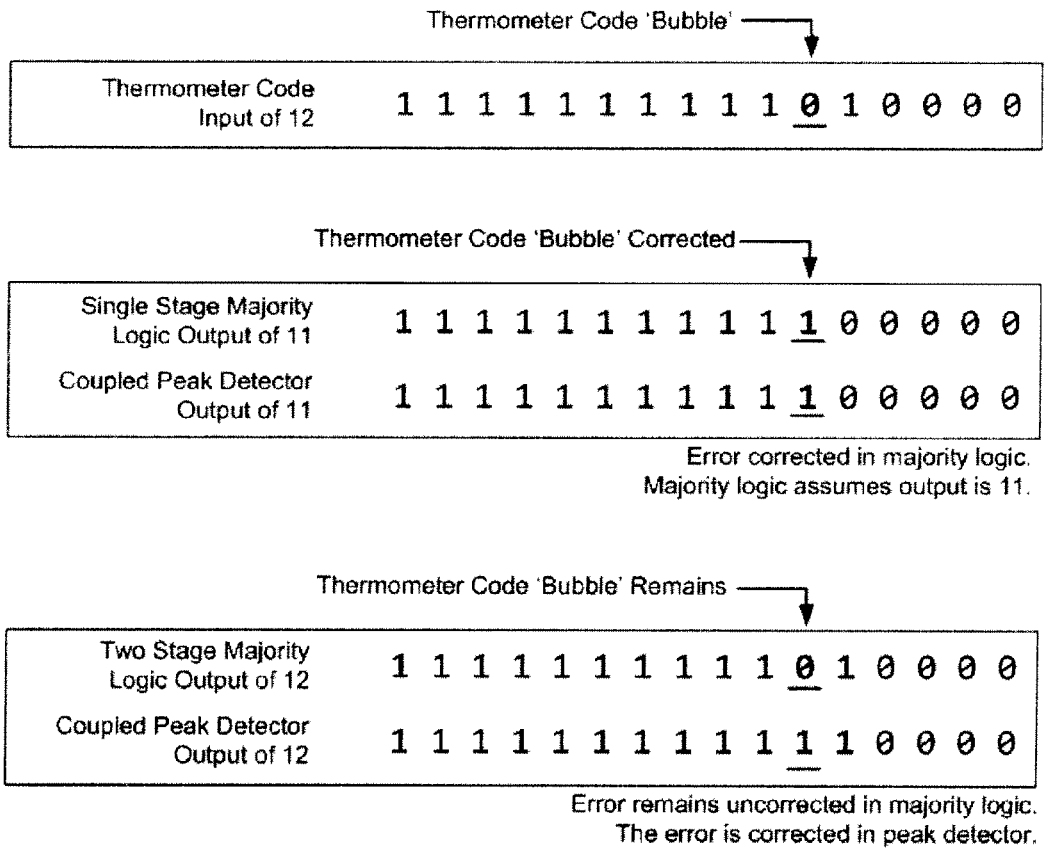
FIG. 5 illustrates a second example error correction process according to an embodiment.

FIGS. 4 and 5 demonstrate examples where the digital peak detector 106 is needed for the further correction of the error in the thermometer coded line. These figures are provided merely for the sake of illustration. Naturally there can be different kind of code error situations and the following examples are merely to better illustrate the correction of the code error.

FIG. 4 shows a situation where two thermometer code error 'bubbles' occur in the thermometer code, represented by the two zeros in the upper box portion of the figure. In this scenario, both single stage and two stage majority logic fail. The thermometer code 1111101010000 is meant to be decimal ten, however because of the code bubbles it could be interpreted as decimal 6 or 8 or 10.

The operation of the single stage, N+/−1, majority logic block is shown in the middle box of the figure. It corrects the code it sees, but leaves a new bubble in the code. The eighth majority logic cell sees the seventh and ninth as zeroes and so assumes that a majority is not met. Although the ninth majority logic cell has voted to be '1' as the eighth and tenth outputs are '1'. So a new problem is created. Again the peak detector solves this as it finds the highest '1' and sets every number beneath it to be '1'. The result is that the single stage majority logic and peak detector combination has taken the error code that could be 6, 8 or 10 and has output 9 which is only one away from what it should be. This is considered to be a success as the code 9 is valid and close to the real value.

The operation of the two stage, N+/−2, majority logic block is shown in the bottom box of the figure. The two stage again misses the bubbles. However the peak detector fills in the gaps or bubbles making sure the highest voted '1' is the only place that a '10' transition occurs. The output code is correct and valid through use of the majority logic and the coupled thermometer code (or base 1) maximum or peak detector.

The last box of the example of table 1 illustrates two stage majority logic 104. The situation has the coded decimal value output of 10 (the code is left to right) where the thermometer code error remains. The error remains uncorrected in the majority logic 104 because the two stage majority logic 104 is not able to correct it. However the error is corrected in the digital peak detector 106. The digital peak detector 106 forces " . . . 101010 . . . " into " . . . 11111 . . . " Therefore a correct thermometer code 1111111111000000 is output.

FIG. 5 shows another example, where a single stage majority logic functions satisfactorily but a two stage majority logic fails. The input to the majority logic block is shown at the top of the diagram. It is a base 1 number of 12 with a 'bubble' or out of place zero There are two boxes beneath the input with the error. The first is showing what would happen with the output from a single stage majority logic and then the output if a thermometer code or base 1 peak detector was attached. The second block at the bottom of the diagram is showing what would happen if a two stage majority voting logic was attached and then if the thermometer code peak detector was used.

Considering the first singe stage box: The majority logic looking at the eleventh digit sees 1's either side of the zero at the eleventh input so that being a ⅔rds majority sets it to 1. The majority logic cell looking at the twelfth digit sees a 1 with two zeroes either side and so that doesn't make a majority (it being ⅓) and then sets it to zero. The single stage majority logic has made a most-likely or highest probability assumption of what the output should be. The thermometer code peak detector here sees that this a valid base 1 code (i.e. there is only one '10' transition and no bubbles) and so it passes through.

The second box shows the operation of a two stage logic: The majority logic cell in the eleventh digit looks to the ninth and thirteenth digits. The ninth has a '1', the eleventh and the thirteenth both have zero so the eleventh majority vote output is zero. However, this doesn't correct this error and we still have two '10' transitions in the code. The majority logic here has failed in correcting the error. If this thermometer code was left to be input to the rest of the system then the error and incorrect code would propagate through. This is where the base-1 code maximum or peak detector comes in. The highest '1' in the code sets all lower digits to '1' making sure that a valid code is output. There is no possibility of an incorrect code coming out of this peak detector, it forces a valid code to be output at all times. Just as in this example, the majority logic doesn't correct it but the base-1 maximum or peak is found and corrects for it.

Figure 6:
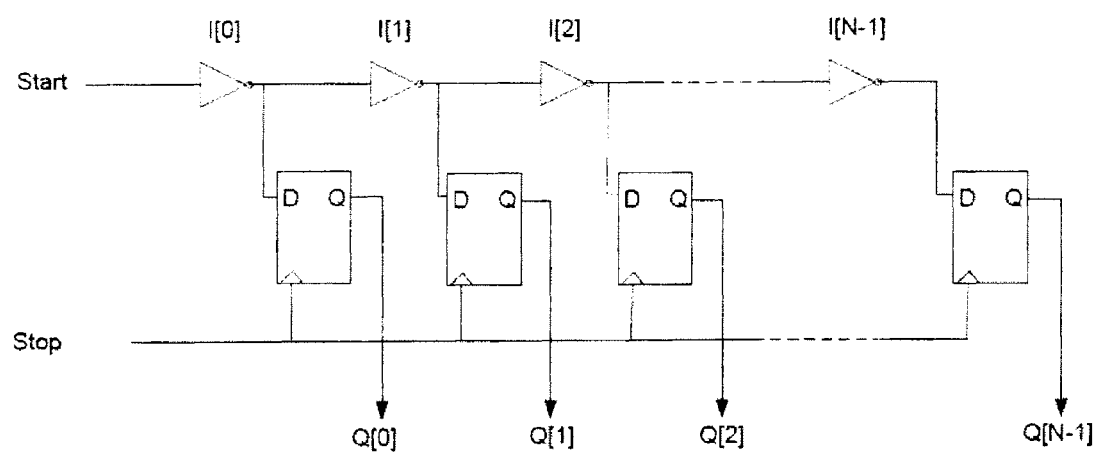
FIG. 6 illustrates an example of a clocked delay line for TDC.
Figure 7:
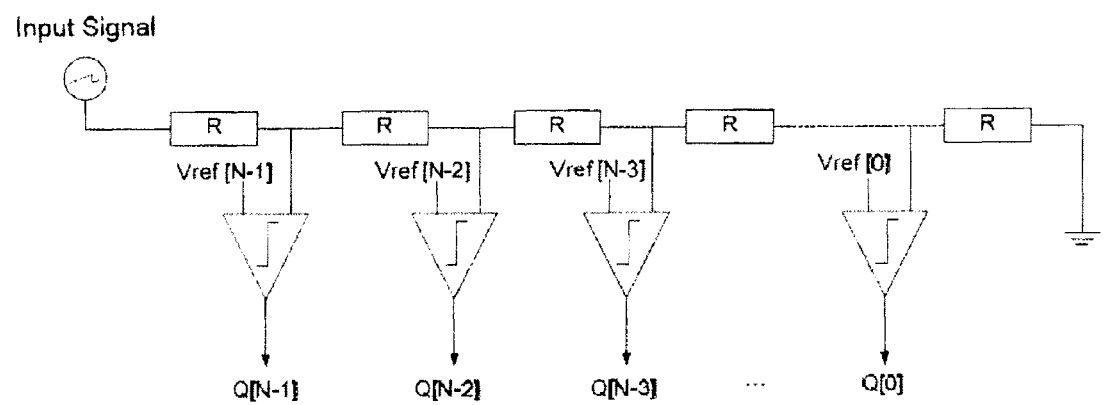
FIG. 7 illustrates an example of resistor line for flash ADC.

FIGS. 6 and 7 show examples of thermometer coded lines 102. FIG. 6 illustrates an example of a clocked delay line for TDC. FIG. 7 illustrates an example of a resistor line for flash ADC. A clocked delay line for a TDC or resistor line for a flash ADC outputs in thermometer code, for example by reference T[0:15] as in the example of FIG. 3. However the "bubbles", i.e. series of code errors or single code errors may appear due to metastability with the flip flops or comparators respectively.

Figure 8:
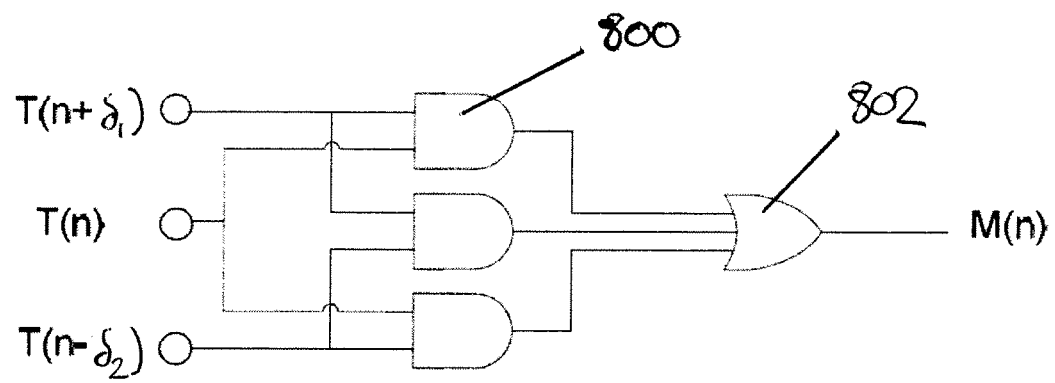
FIG. 8 depicts an example of majority logic cell (MLC)

As shown in FIG. 3, a word obtained from the thermometer code read unit 102 of a given length is converted by the majority logic 104 to another word of the same length; an example sixteen bit word is illustrated in FIG. 3 although it will be appreciated that the principles apply for any word size. FIG. 8 illustrates a unit majority logic cell. For a given position, n, within the input code (T(n)), a corresponding output of the majority logic, M(n), is derived from comparison of the input code T(n) and two of its neighbors T(n+delta1) and T(n−delta2) where delta1 and delta2 represent neighboring bits on either side of the central value. Usually the absolute values of delta1 and delta2 will be the same. In the majority logic cell, the outputs from the thermometer code read unit, T(n+delta1), T(n) and T(n−delta2) are fed to a series of AND gates 800 which then provide the inputs for a triple input OR gate 802. The result of this is that the output M(n) is a majority vote taken from the three inputs, that is if two or more of the three inputs are equal to 1, a 1 will be output, whereas if two or more of the three inputs are equal to 0, a 0 will be output.

Figure 9:
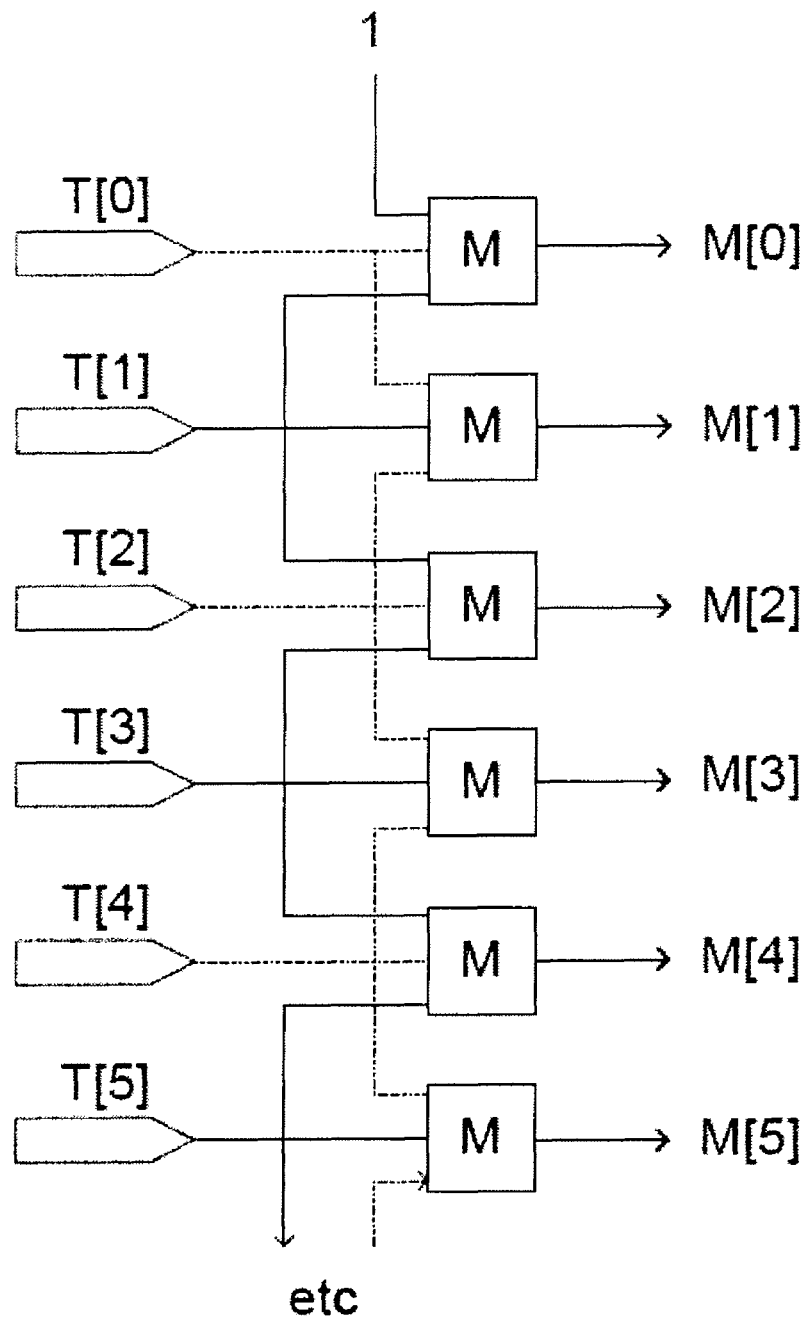
FIG. 9 depicts an example of an N±1 majority logic block.

In an embodiment of the disclosure each majority logic cell is coupled to an output T(n) and its two consecutive neighbors in each direction, T(n+1) and T(n−1). This is referred to as an "n+/−1" majority logic block and is illustrated in FIG. 9. In FIG. 9, the boxes labeled M represent the majority logic cells shown previously in FIG. 8. In the output code T[0:15], the majority logic output M(n) for a given bit T(n) is formed from the majority logic decision of T(n−1), T(n), and T(n+1). For the very first bit in the sequence, T[0], the majority logic output is set to be a comparison of a default "1" together with the first and second bits T[0] and T[1] of the input word. In the present disclosure, this array is termed a "single stage" majority logic because a single array of majority logic cells can be provided to perform the n+/−1 majority logic decision.

Figure 10:
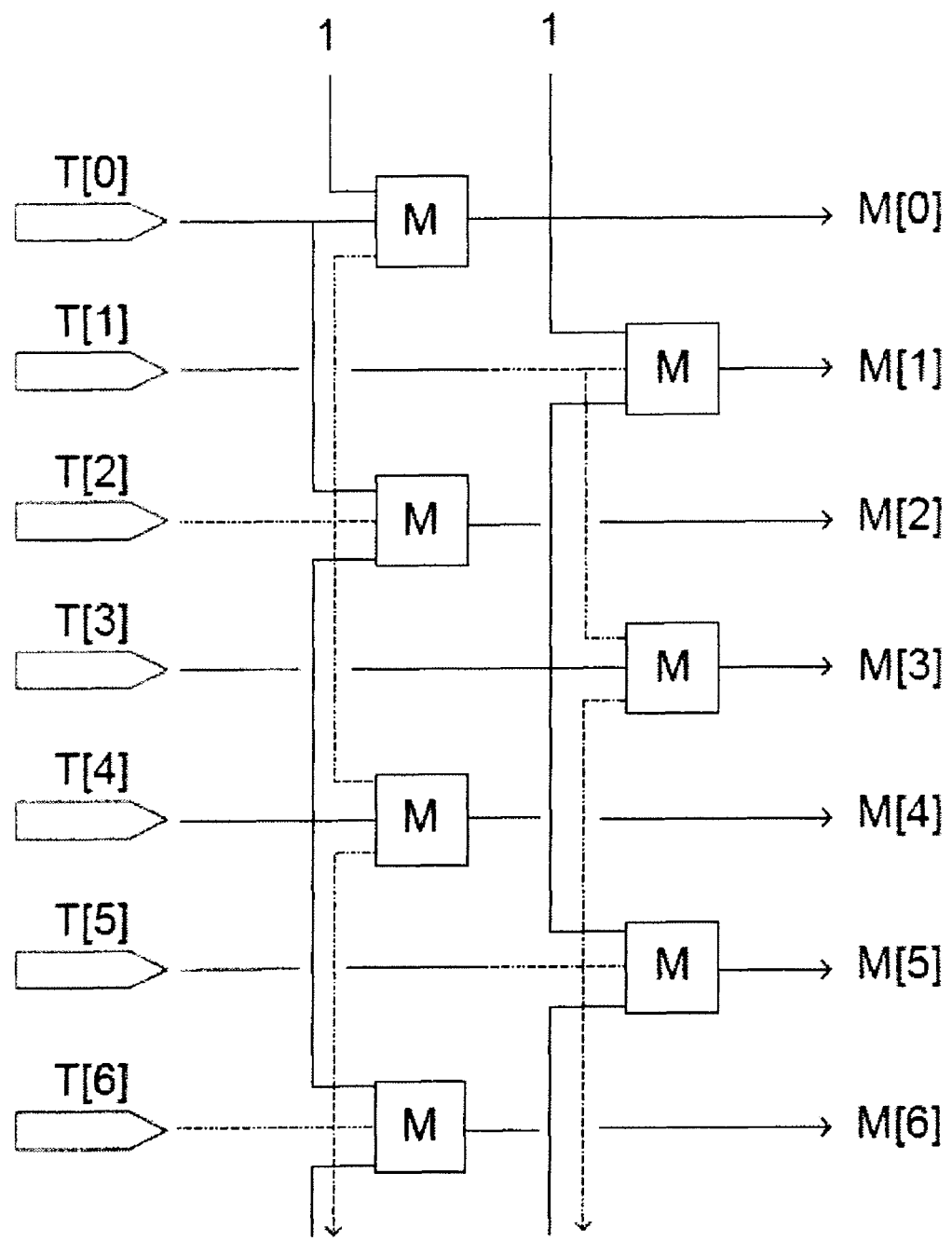
FIG. 10 depicts an example of an N±2 majority logic block.

In an alternative embodiment each majority logic each majority logic cell is coupled to an output T(n) and its two next-but-one neighbors in each direction, T(n+2) and T(n−2) and is illustrated in FIG. 10. In the present disclosure, this array is termed an "n+/−2" majority logic block. Again, the boxes labeled M represent the majority logic cells shown previously in FIG. 8. This array is termed a "two stage" majority logic block because it is effectively formed as two single stage majority blocks, one which reads the even bits and one which reads the odd bits of the input word, T[0:15]. Similarly, as for FIG. 9, the initial bit for each of the stages is set to 1.

Figure 11:
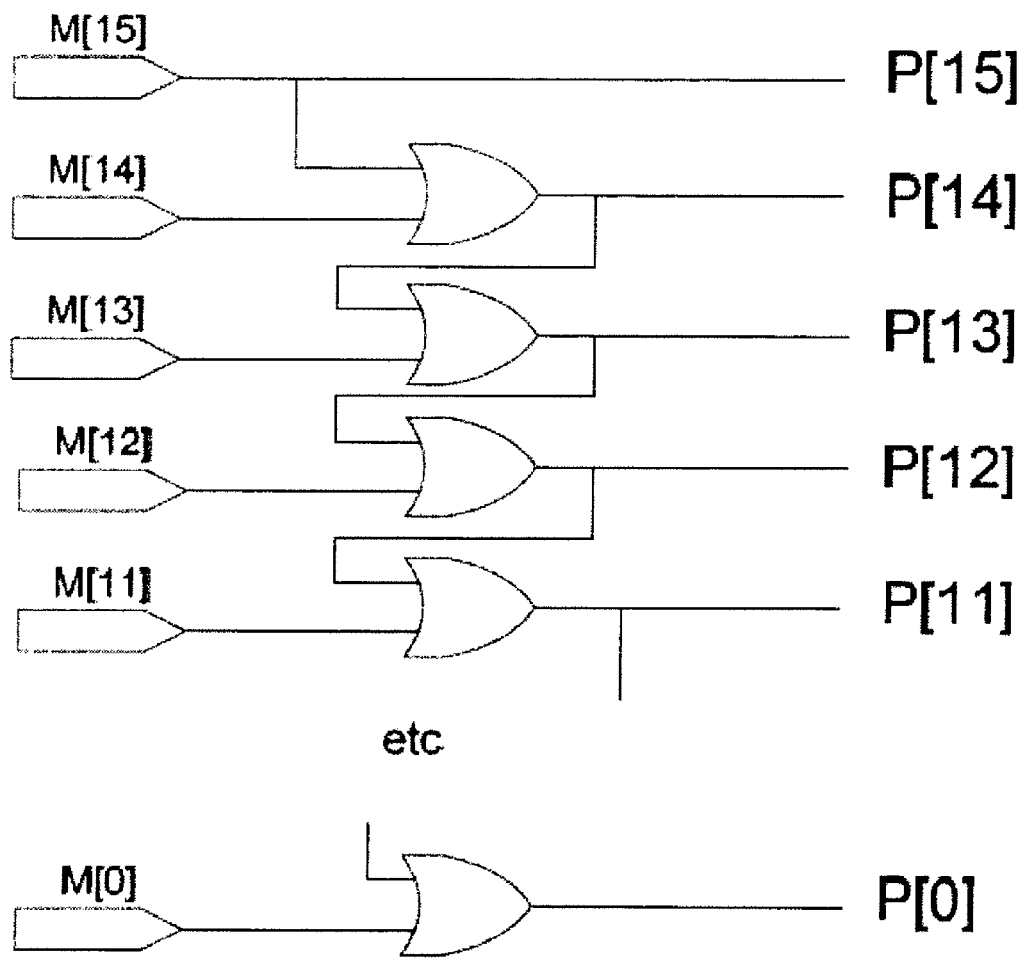
FIG. 11 depicts a digital peak detector combinational logic block.

Referring now to FIG. 11 there is being depicted an embodiment of the digital peak detector 106. The digital peak detector 106 is coupled to the output of the majority logic block 104. This kind of coupling and logic better ensures the output as a valid thermometer coded value. In an embodiment of the disclosure the digital peak detector 106 is coupled to non-volatile based binary converter such as ROM-based binary converter 110.

The figure shows a structure comprising a plurality of cascaded OR gates 1100. The highest input, in this example '15', is taken and fed through to its respective output. The input of 15 and 14 are fed together into an OR gate. If 15 is low and 14 is high then the output of 14 will be high. The output of 14 is then cascaded down to the next OR gate to ensure that if 14 is high, then 13 is high and all subsequent and lower numbers are high, i.e. if a maximum at 14 is found then all lower outputs are forced high (regardless of whether they are high or low) to guarantee that a valid thermometer code is readout, without code bubbles being output. In this way, the highest, or peak, value where a "1" occurs is detected, and all values from that point onwards are forced to 1. It will be appreciated that other alternative circuitry could be used depending on the desired implementation. The term "peak detector" in the context of a thermometer code means any circuitry that can identify the highest-value occurrence of a first logical state (usually "1") in the thermometer code and then drive the values below that detected highest value also to that detected logical state (usually "1").

In an embodiment of the disclosure the digital peak detector 106 is coupled with a combinational logic thermometer to binary converter. Thus digital peak detector can be configured to feed either a ROM-based binary converter 110 or a combinational logic thermometer to binary converter. A combinational block may have lower static power consumption than a ROM-based block 110. In an embodiment of feeding the ROM based binary converter 110, the digital peak detector 106 output is configured to be encoded to 1 of N logic 108 for ROM lookup 110. A first example of this is shown in FIG. 12, in which the 1 of N logic comprises a set of connected NOT and NAND gates which operate to output a single "1" at the point of transition from 0 to 1 in the input word P[0:15]. An alternative embodiment of the 1 of N logic uses XOR gates, as shown in FIG. 13.

Figure 14:
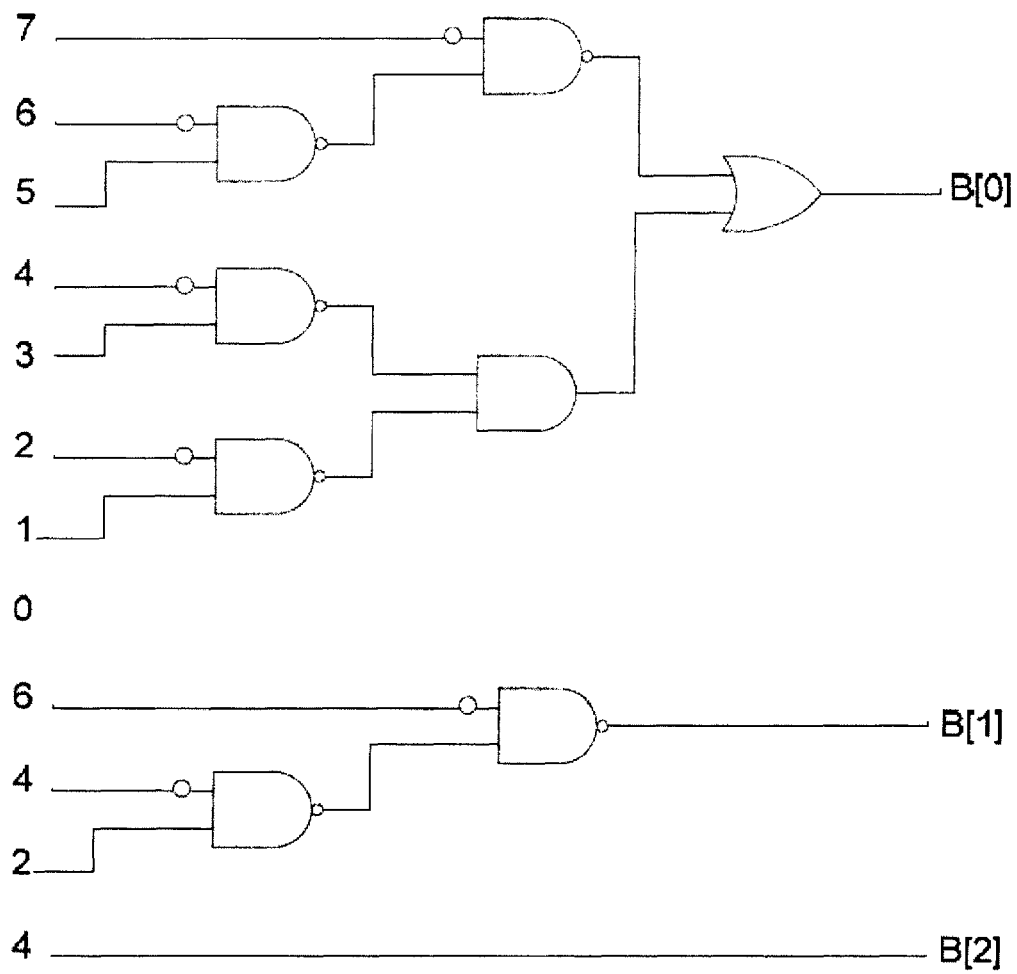
FIG. 14 depicts a combinational logic block for eight bit thermometer to three bit binary conversion.

In another embodiment the digital peak detector 106 is configured to feed a combinational block, for example a 7 bit thermometer code to 3 bit binary converter. This is illustrated in the example of FIG. 14. The output from the circuit is the natural binary coded value of the error corrected state of the delay or resistor line.

Figure 15:
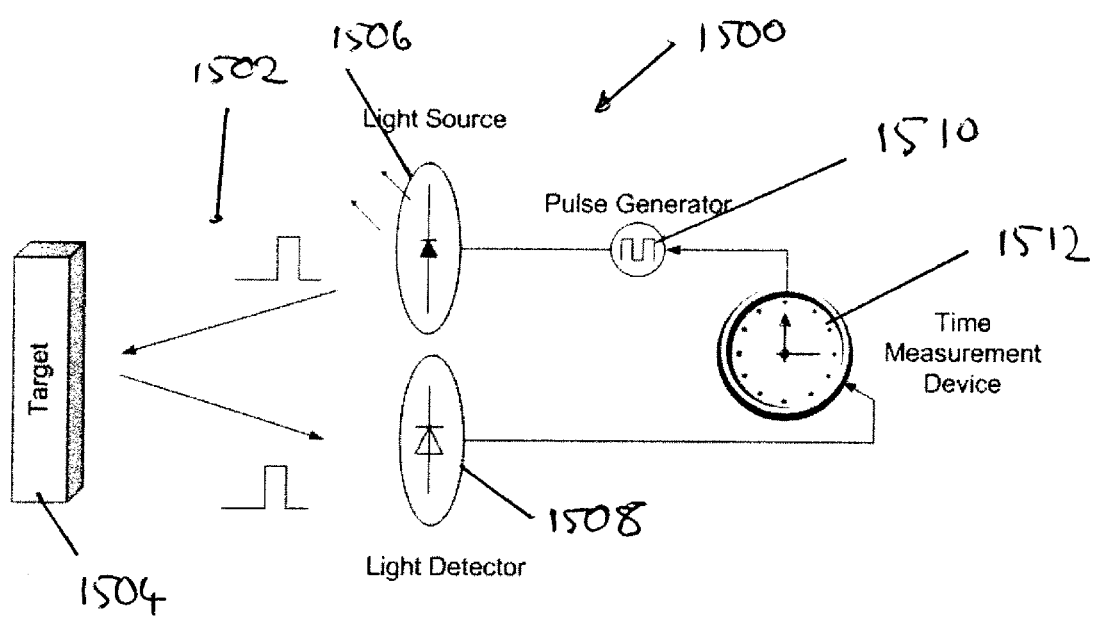
FIG. 15 depicts a measurement device according an embodiment of the disclosure to measure a distance to a target object.

FIG. 15 depicts an example of a measurement device 1500 according an embodiment of the disclosure to measure a distance 1502 to the target object 1504. The measurement device 1500, alternatively referred to as a range finder, comprises the integrated circuit (not shown in FIG. 15) according to the embodiments of FIGS. 1 to 14. For the sake of illustration a light source 1506, light detector 1508, pulse generator 1510 and the time measurement device 1512 (such as Time to Digital Converter, TDC) are depicted. The exemplary operations and configurations of these features are described with reference to FIGS. 1 to 14. The measurement device 1500 can be applied in various contexts. A list of exemplary application possibilities is given here merely to illustrate various possibilities of the applicability of the range measurement devices. These include, but are not restricted to, binoculars, rifle or gun scopes, vehicles such as cars or motorcycles, helicopters or airplanes, construction tools and devices etc.

Figure 16:
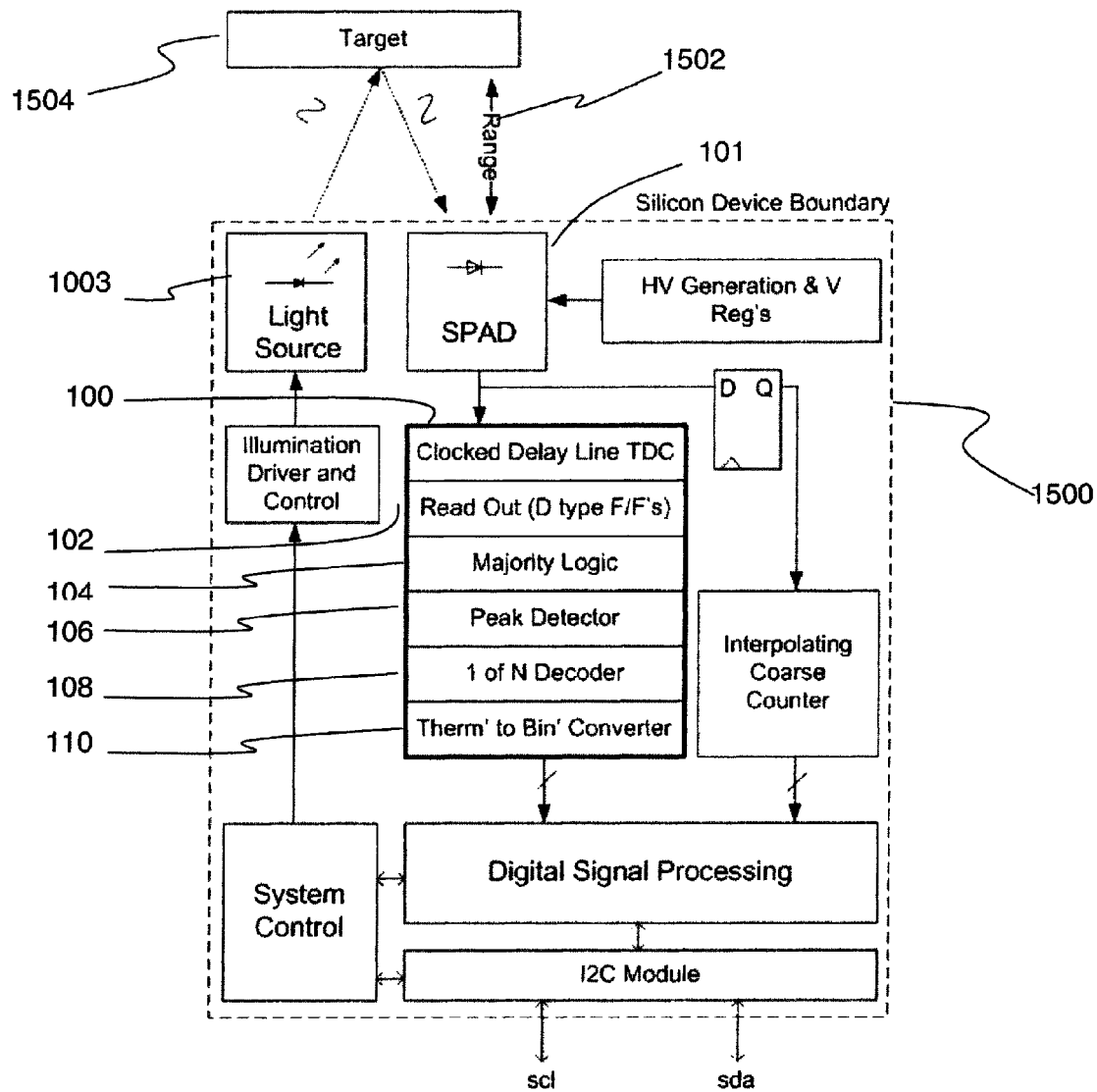
FIG. 16 depicts a block diagram of the apparatus according to an embodiment.

FIG. 16 depicts a block diagram of the apparatus 1500 according to an embodiment. The operations and configurations of the measurement apparatus as shown in FIG. 16 are illustrated with reference to the examples of FIGS. 1 to 15. Thus the measurement apparatus 1500 comprises the SPAD unit 101. Further the delay line unit 100, the thermometer code read out unit 102, the majority logic 104, the digital peak detector 106, 1 of N logic 108 and the binary conversion 110 are shown. The light source 1506 sends a pulse to the target 1504 and the reflection is received at the SPAD unit 101, thereby measuring the range 1502 partly with the aid of the configurations and operations of the units 100-110 as described in the examples above. The apparatus 100 has a processor such as a digital signal processor and the system control to output the user of the apparatus 1500 understandable indication of the range 1502. For example the user can read a valid range such as 1 meter indicating an actual distance of 1 meter from the apparatus to the target 1504. Naturally there can be other kind of indications or measures of the range 1502.

In one or more exemplary embodiments, the functions and configurations described may be implemented in hardware, software, firmware, or any combination thereof. If implemented in software, the functions can be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" or "coupled with" another element, it can be directly connected or coupled to the other element or intervening elements may be present. In contrast, when an element is referred to as being "directly connected to" or "directly coupled to" another element, it's possible that there are no intervening elements present.

While this detailed description has set forth some embodiments of the present disclosure, the appended claims cover other embodiments of the present disclosure which differ from the described embodiments according to various modifications and improvements. The scope of protection of the disclosure is determined by the independent claims and any equivalents.

What is claimed is:

1. An apparatus including an integrated circuit, comprising:
   a thermometer coded line configured to convert a time interval to a digital code for subsequent processing in order to output a value representative of said time interval; and
   a digital peak detector coupled to the thermometer coded line and configured for correction of undesired code within said digital code in order to ensure a valid output of said value.

2. The apparatus according to claim 1 wherein the integrated circuit further comprises a majority logic coupled to the thermometer coded line and the digital peak detector, wherein the majority logic is configured for correction of undesired code of said digital code in order to ensure the valid output of said value.

3. The apparatus according to claim 2, wherein the majority logic is configured to correct first errors in the undesired code and the digital peak detector is configured to correct second errors in the undesired code left uncorrected by the majority logic.

4. The apparatus according to claim 2, wherein the majority logic is coupled between the thermometer coded line and the digital peak detector.

5. The apparatus according to claim 2, wherein the majority logic is coupled to an output of the thermometer coded line.

6. The apparatus according to claim 2, wherein the majority logic is coupled to an output of the thermometer coded line and two consecutive neighboring outputs of said output.

7. The apparatus according to claim 2, wherein the majority logic is coupled to an output of the thermometer coded line and two up and two down neighboring outputs of said output.

8. The apparatus according to claim 2, wherein the digital peak detector is coupled to the output of the majority logic.

9. The apparatus according to claim 1, wherein the digital peak detector is coupled to a binary converter, and the digital peak detector is configured to feed the binary converter so that the digital peak detector is configured to output encoded 1 of N logic output to a lookup table of the binary converter, wherein binary converter is configured to match from the lookup table the corresponding value matching the output.

10. The apparatus according to claim 1, wherein the digital peak detector is coupled to a combinational logic thermometer to binary converter, and the digital peak detector is configured to feed the combinational logic thermometer to binary converter with a thermometer code, wherein the combinational logic thermometer to binary converter is further configured to output the value corresponding to the code.

11. The apparatus according to claim 1, wherein the thermometer coded line comprises a clocked delay line for a time to digital converter (TDC).

12. The apparatus according to claim 1, wherein the thermometer coded line comprises a resistor line for a flash analog to digital converter (ADC).

13. The apparatus according to claim 1, wherein the thermometer coded line further comprises a thermometer code read out unit coupled to the thermometer coded line, wherein the thermometer code read out unit is configured to receive input from the thermometer coded line and output said digital code.

14. The apparatus according to claim 1, wherein the apparatus comprises an optical range finder apparatus configured to measure a physical distance to a target.

15. The apparatus according to claim 14, further comprising diodes configured to produce an electrical pulse on a reception of a photon indicative of the time of flight of a pulse of light travelling the range for measuring the distance to the target.

16. A method, comprising:
converting a time interval to a digital code for subsequent processing in order to output a value representative of said time interval in a thermometer coded line; and
correcting an undesired code of said digital code in order to ensure a valid output of said value in a digital peak detector coupled with the thermometer coded line.

17. An apparatus including an integrated circuit, comprising:
a clocked delay line time to digital converter (TDC) configured to convert a time interval to a digital code for subsequent processing in order to output a value representative of said time interval; and
a majority logic coupled with the clocked delay line TDC, the majority logic configured for correction of an undesired code of said digital code in order to ensure a valid output of said value.

18. The apparatus of claim 17 wherein the integrated circuit further comprises a digital peak detector coupled to the thermometer coded line configured for correction of undesired code of said digital code in order to ensure a valid output of said value.

19. The apparatus according to claim 18, wherein the majority logic is configured to correct first errors in the undesired code and the digital peak detector is configured to correct second errors in the undesired code left uncorrected by the majority logic.

* * * * *